United States Patent
Hopkins (10) Patent No.: US 7,250,805 B2
(45) Date of Patent: *Jul. 31, 2007

(54) METHODS FOR MULTIPLEXING

(75) Inventor: Michael Hopkins, Tracey, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/350,417

(22) Filed: Feb. 9, 2006

(65) Prior Publication Data
US 2006/0125545 A1 Jun. 15, 2006

Related U.S. Application Data

(63) Continuation of application No. 10/974,389, filed on Oct. 27, 2004, now Pat. No. 7,030,679.

(60) Provisional application No. 60/591,993, filed on Jul. 29, 2004.

(51) Int. Cl.
*H03K 17/00* (2006.01)
(52) U.S. Cl. .................. 327/407; 327/99; 327/413
(58) Field of Classification Search ........... 327/99, 327/108, 407, 413
See application file for complete search history.

(56) References Cited

U.S. PATENT DOCUMENTS

| 4,191,856 | A | 3/1980 | Nagano et al. |
| 5,289,048 | A | 2/1994 | Ishihara et al. |
| 5,352,987 | A | 10/1994 | Harvey |
| 5,926,068 | A | 7/1999 | Harr |
| 6,072,360 | A | 6/2000 | McCullough |
| 6,489,845 | B1 | 12/2002 | Maschhoff |
| 6,707,405 | B2 | 3/2004 | Kuttner |
| 7,030,679 | B2 * | 4/2006 | Hopkins .......... 327/407 |

OTHER PUBLICATIONS

Video Multiplexer Delivers Lower Signal Degradation (HA5024), Application Note AN9508. 1, Intersil Corp., 2 pp. (Nov. 1996).
LMH6572 Triple 2:1 High Speed Video Multiplexer, Applications DS201096, National Semiconductor Corp., 12 pp. (Aug. 2004).
Triple and Quad, 2:1 Video Multiplexer-Amplifiers with Fixed and Settable Gain, Applications 19-2758, Maxim Integrated Products, 22 pp. (Jan. 2003).

* cited by examiner

*Primary Examiner*—Kenneth B. Wells
(74) *Attorney, Agent, or Firm*—Fliesler Meyer LLP (57) ABSTRACT

A multiplexer circuit includes a plurality of switched differential amplifier circuits, one of which can be selected at a time. Each switched differential amplifier includes a pair of differential inputs and a pair of differential outputs, with each pair of differential inputs accepting a corresponding pair of input signals. Each of the switched differential amplifier circuits is configured to present a current mode version of its input signals at its differential outputs when the switched differential amplifier circuit is selected, and to present substantially zero level output signals at its differential outputs when the switched differential amplifier circuit is deselected. The multiplexer circuit also includes a selector that accepts a select signal and selects one of the plurality of switched differential amplifier circuits based on said select signal. A current mirror is used to combine a pair of multiplexer outputs into a single ended output, a version of which is used for feedback.

16 Claims, 5 Drawing Sheets

METHODS FOR MULTIPLEXING

PRIORITY CLAIM

This application is a continuation of U.S. patent application Ser. No. 10/974,389, filed Oct. 27, 2004, which matured into U.S. Pat. No. 7,030,679, which claims priority under 35 U.S.C. 119(e) to U.S. Provisional Patent Application No. 60/591,993, filed Jul. 29, 2004.

FIELD OF THE INVENTION

Embodiments of the present invention relate to the field of integrated circuits, and more specifically to analog multiplexing circuits.

BACKGROUND

The purpose of analog multiplexing circuits is to select one input from a number of analog inputs and reproduce the selected input faithfully at an output. Ideally, the multiplexer is wideband, has no feed through of unselected inputs, and can handle a reasonably wide range of input voltages from the unselected channels without causing damage to the internal circuitry of the multiplexer.

Unfortunately, high-speed semiconductor processes do not support large voltages without breakdown. Unless a schottky diode is available, the only high-speed junction available for switching function is a transistor's base-emitter (or equivalent) junction, which can be limited to as little as 1.5V of reverse bias, severely limiting the magnitude of input signals. Unfortunately, schottky diodes can not be produced using many types of semiconductor processes. Accordingly, it would be beneficial to provide an analog multiplexing circuit that can handle large input voltages and achieve high (e.g., GHz) frequency responses, without requiring a schottky diode.

SUMMARY OF THE PRESENT INVENTION

Embodiments of the present invention are directed to analog multiplexing circuits, as well as the circuits that can be used to make up analog multiplexing circuits.

In accordance with an embodiment of the present invention, a multiplexer circuit includes a plurality of switched differential amplifier circuits, one of which can be selected at a time. Each switched differential amplifier circuits includes a pair of differential inputs and a pair of differential outputs, with each pair of differential inputs accepting a corresponding pair of voltage input signals including a first input signal and a second input signal. Each switched differential amplifier circuit also includes a pair of switched input stages, each of which accepts one of the first and second input signals.

In accordance with an embodiment of the present invention, each switched input stage is configured to, when selected, present a substantially unmodified version of its input signal at its output. Additionally, each switched input stage is configured to, when deselected, produce a rejection voltage signal of substantially equal magnitude and opposite polarity to its input signal in order to reject the input signal and thereby present a substantially constant voltage at its output regardless of variations in the input signal. In accordance an embodiment of the present invention, this rejection voltage signal is produced using a transconductance circuit. More specifically, the transconductance circuit converts the input signal to a proportional current signal that, when the switched input stage is selected, flows through a passive resistance in order to produce the rejection voltage signal.

Further features, embodiments and details, and the aspects, and advantages of the present invention will become more apparent from the detailed description set forth below, the drawings and the claims.

DETAILED DESCRIPTION OF THE PREFERRED EMBODIMENT

Figure 1A:
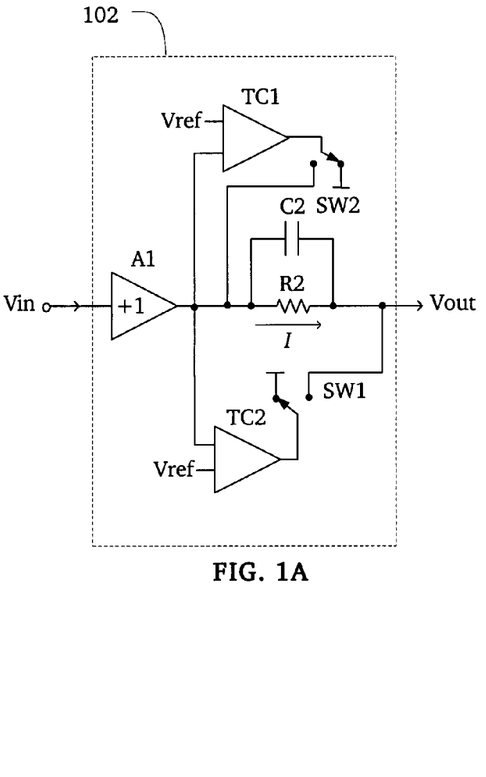
FIGS. 1A-1C are circuit diagrams of switched input stages, according to embodiments of the present invention.

FIG. 1A is a circuit diagram of an input stage 102 according to an embodiment of the present invention. The input stage 102 is shown as including an input buffer A1, a resistor R2, a capacitor C2, a pair of transconductors TC1 and TC2, and a pair of switches SW1 and SW2. While use of the buffer A1 is customary to unload the input signal source, it is not strictly necessary, and thus need not be included. If the buffer A1 is used, an input signal Vin that is presented at an input to the buffer A1 is passed through the buffer A1, which presents a buffered version of the input signal Vin to resistor R2 and transconductors TC1 and TC2. If the buffer A1 is not used, the input signal Vin will be presented directly to resistor R2 and transconductors TC1 and TC2. As will be understood from the discussion of FIG. 1C below, in an accordance with an embodiment of the present invention, each trandconductor can be implemented using an RC circuit and a current mirror. Further, transconductors TC1 and TC2 may be referred to hereafter collectively, or individually, as a transconductance circuit.

When the switches SW1 and SW2 are in the selected positions (to the ground and supply positions, respectively, as shown in FIG. 1A), the buffered version of the input signal Vin simply passes through resistor R2 substantially unmodified and is presented at the output of the input stage 102 as Vout (capacitor C2 is used to pass the input signal Vin around resistor R2 at high frequencies). Thus, if the desire is to pass the input signal Vin through the input stage 102, the switches SW1 and SW2 should be connected as shown, such that the output currents of transconductors TC1 and TC2 are shunted away from resistor R2. The input stage 102 will be said to be "selected" when it produces a substantially unmodified voltage mode version of its input at its output, as just described.

To reject the input signal Vin, switches SW1 and SW2 are switched to the deselected positions (the positions opposite to those shown in FIG. 1A). When switches SW1 and SW2 are in the deselected position, a current sourced from transductor TC1 flows through resistor R2 and is sunk into the output of transconductor TC2. This transconductor current produces a voltage drop, which is opposite in phase to Vin, across resistor R2, pulling the Vout node of input stage 102 to a known "deselect" voltage that is set by the current and gm (i.e., transconductance) of the transconductors TC1 and TC2. This "deselect" voltage can be any value, but is nominally equal to the lowest voltage value of the multiplexer's intended common mode range. This "deselect" voltage is set by selecting the gm of each transconductor. This is done in practice by changing the current available (nominally, the current and gm of TC1 and TC2 are equal) from each transconductor. Since the transconductors are driven by the input signal Vin of the input stage, their resultant output currents track the input voltage, producing a rejection voltage which is equal, but opposite in phase, to the input voltage, Vin, thus cancelling the effects of Vin at the Vout node. The input stage 102 will be said to be "deselected" when it rejects its input signal, as just described.

Figure 1B:
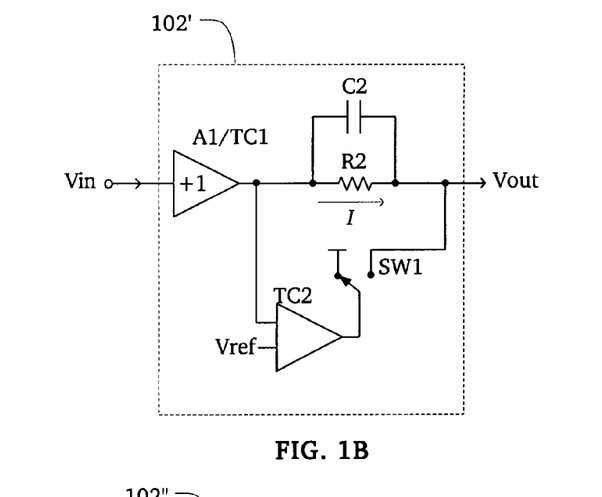

FIG. 1B is a circuit diagram of an input stage 102', according to another embodiment of the present invention. In this embodiment, the amplifier A1 acts as one of the transconductors, and thus, is labeled A1/TC1 (eliminating the need for the separate transconductor TC1 shown in FIG. 1A). While the buffer/transconductor1 A1/TC1 can be used to unload the input signal source, it is not strictly necessary, and thus need not be included. If buffer/transconductor1 (A1/TC1) is not physically included, then the input signal source (not shown) will function as the transconductor1 (TC1). As will be discussed below with reference to FIG. 1C, the trandconductor2 (TC2) can be implemented using an RC circuit and a current mirror.

Figure 1C:
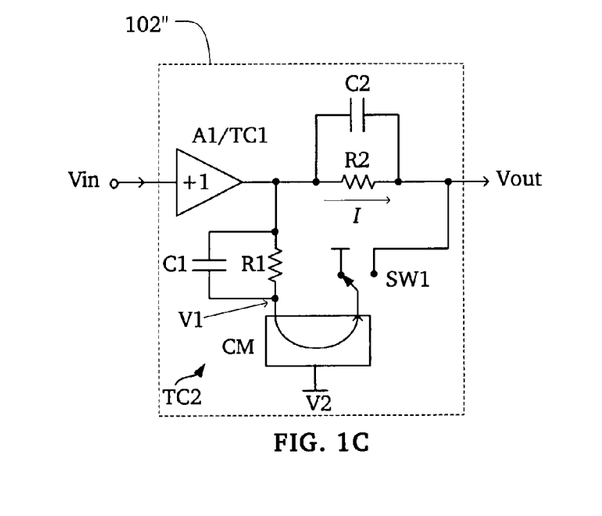

FIG. 1C shows an input stage 102" including an input buffer/transconductor1 (A1/TC1), resistors R1 and R2, capacitors C1 and C2, a current mirror/transconductor2 (CM/TC2) and a switch SW1. While the buffer/transconductor1 (A1/TC1) can be used to unload the input signal source, it is not strictly necessary, and thus need not be included. If buffer/transconductor1 (A1/TC1) is not physically included, the input signal source (not shown) then functions as the first transconductor1 (TC1). If the buffer/transconductor1 (A1/TC1) is used, an input signal Vin that is presented at an input to the buffer/transconductor1 (A1/TC1) is passed through the buffer/transconductor1 (A1/TC1), which presents a buffered version of the input signal Vin to resistor R1 and resistor R2. If the buffer/transconductor1 (A1/TC1) is not used, the input signal Vin will be presented directly to resistors R1 and R2.

When the switch SW1 is in the selected position (the left position shown in FIG. 1C), the buffered version of the input signal Vin simply passes through resistor R2 substantially unmodified and is presented at the output of the input stage 102 as Vout (capacitor C2 is used to pass the input signal Vin around resistor R2 at high frequencies). Thus, if the desire is to pass the input signal Vin through the input stage 102, the switch SW1 should be connected as shown, such that the output current of the current mirror/transconductor2 (CM/TC2) is not passed to the output side of resistor R2. The input stage 102 will be said to be "selected" when it produces a substantially unmodified voltage mode version of its input at its output, as just described.

To reject the input signal Vin, the switch S1 is switched to the deselected position (the right position shown in FIG. 1A). When the switch SW1 is in the deselected position, the signal source (or, if included, the buffer/transconductor1 (A1/TC1)), the resistor R1, and the input of CM act as a transconductor, converting Vin to a control current. This control current, which is presented to the input of the current mirror/transconductor2 (CM/TC2), is a function of the capacity of the input signal source (or, if included, buffer/transconductor1 (A1/TC1)), the voltage drop across resistor R1, the value of resistor R1, and the input drop of the CM/TC2 input. If transconductor/current mirror CM/TC2 is a simple current mirror, and is designed such that its output current is substantially equal to its input control current, then current sourced from the input signal source (or, if included, buffer/transconductor1 (A1/TC1)) flows through resistor R2 and is sunk by the output of the transconductor/current mirror output (CM/TC2). The input signal source (or if included, buffer/transconductor1 (A1/TC1)), in this case, should have the capacity to provide at least twice the current sunk by the output of transconductor/current mirror CM/TC2. Assuming A1/TC1 capacity and also if R1=R2, then the current (I) flowing from R2 at the Vout node, will cause a voltage drop across R2 in direct proportion, but opposite in phase, to that of the driving input signal, Vin, thus creating a constant voltage substantially equal to V1 at the Vout node, canceling the Vin signal. The input stage 102 will be said to be "deselected" when it rejects its input signal, as just described.

Figure 2:
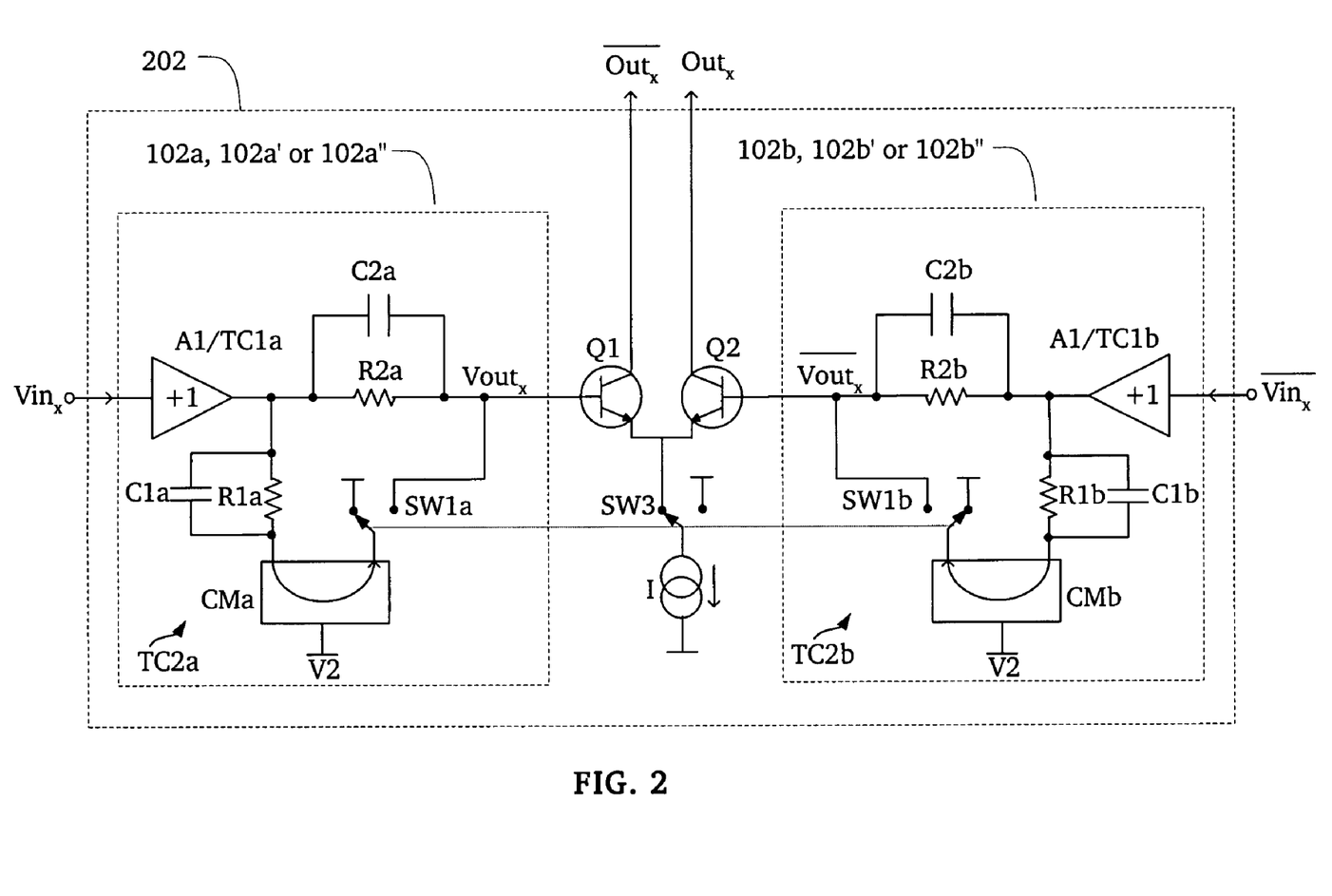
FIG. 2 is a circuit diagram of a switched differential amplifier, according to an embodiment of the present invention.

FIG. 2 is a circuit diagram of a switched differential amplifier 202 according to an embodiment of the present invention. As shown, the switched differential amplifier 202 includes a pair of switched input stages 102a" and 102b" from FIG. 1C (or alternatively 102a and 102b from FIG. 1A, or 102a' and 102b' from FIG. 1B). Additionally, the switched differential amplifier includes a differential pair of transistors Q1 and Q2, a switch SW3 and a current source I. The outputs of the switched input stages are provided to the bases of transistors Q1 and Q2, respectively. The switch S3 selectively connects the emitters of transistors Q1 and Q2 to the current source I. The collectors of transistors Q1 and Q2 form the outputs (Out$_x$ and Out$_x$_bar) of the switched differential amplifier 202.

When the switched differential amplifier 202 is "selected," both input stages 102a and 102b are "selected," and the switch SW3 is switched such that the emitters of transistors Q1 and Q2 are connected to the current source I, as shown in FIG. 2. This will cause the input signals (Vin$_x$ and Vin$_x$_bar) to pass in voltage mode, substantially unmodified through the switched input stages 102a" and 102b", causing the output signals (Iout$_x$ and Iout$_x$_bar) to be current mode equivalents of the inputs signals (Vin$_x$ and Vin$_x$_bar). With the emitters of transistors Q1 and Q2 connected to the current source I, the transistors Q1 and Q2 are turned on, and the differential pair of transistors Q1 and Q2 act as a normal differential amplifier with the output (Out$_x$ and Out$_x$_bar) of the differential amplifier being presented at the collectors of the transistors.

When the switched differential amplifier 202 is "deselected," both switched input stages 102a" and 102b" are "deselected" and held at a substantially constant, substantially equal, and below common mode voltage (in accordance with the explanation of FIGS. 1A-1C), and the switch S3 is switched such that the emitters of transistors Q1 and Q2 are not connected to the current source I, input signals (Vin$_x$ and Vin$_x$_bar) will be rejected, causing the output signals (Iout$_x$ and Iout$_x$_bar) to be substantially reduced. With the emitters of transistors Q1 and Q2 not connected to the current source I, the transistors Q1 and Q2 are turned off. This results in further input signal rejection with substantially zero level current outputs (Out$_x$ and Out$_x$_bar) at the collectors of the transistors Q1 and Q2. In this manner, substantially none of the input signals (Vin$_x$ and Vin$_x$_bar) will propagate to the outputs (Out$_x$ and Out$_x$_bar) of the switched differential amplifier 202, when the amplifier 202 is "deselected". Thus, when "deselected," the switched input stages and the differential amplifier provide for double isolation of the input signal.

Figure 3:
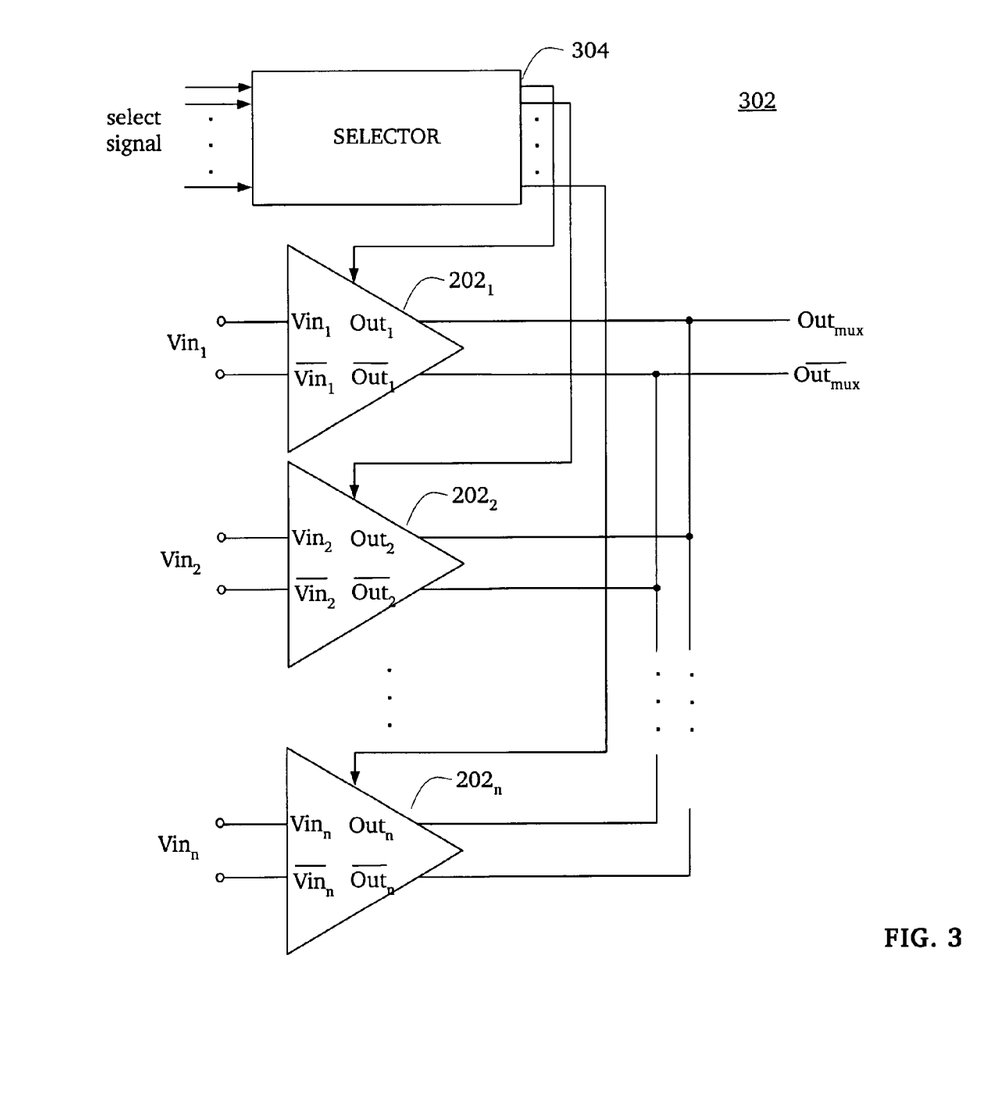
FIG. 3 is a circuit diagram of a multiplexer, according to an embodiment of the present invention.

FIG. 3 shows multiple switched differential amplifiers 202 of FIG. 2 connected as a multiplexer 302. A selector 304 (e.g., a multi-bit decoder) accepts a select signal (e.g., binary data) and turns on exactly one of its outputs based on the select signal. For a more specific example, the selector 304 can have m binary inputs, useful for selecting 1 of $2^m$ outputs. In this manner, the selector 304 is used to "select" one of the switched differential amplifiers $202_1$-$202_n$ (where $n \geq 2$). The selected differential amplifier 202 sets its internal switches to allow the selected analog input to propagate through the differential amplifier. The outputs of the selected switched differential amplifier 202 are connected together (e.g., wired together) with the corresponding outputs of the other switched differential amplifiers, which are each "deselected". As explained in detail above, the outputs of the "deselected" switched differential amplifier(s) 202 will be substantially equal to zero, and thus, generally not affect the outputs of the multiplexer 302 ($Out_{mux}$ and $Out_{mux}$_bar).

Figure 4:
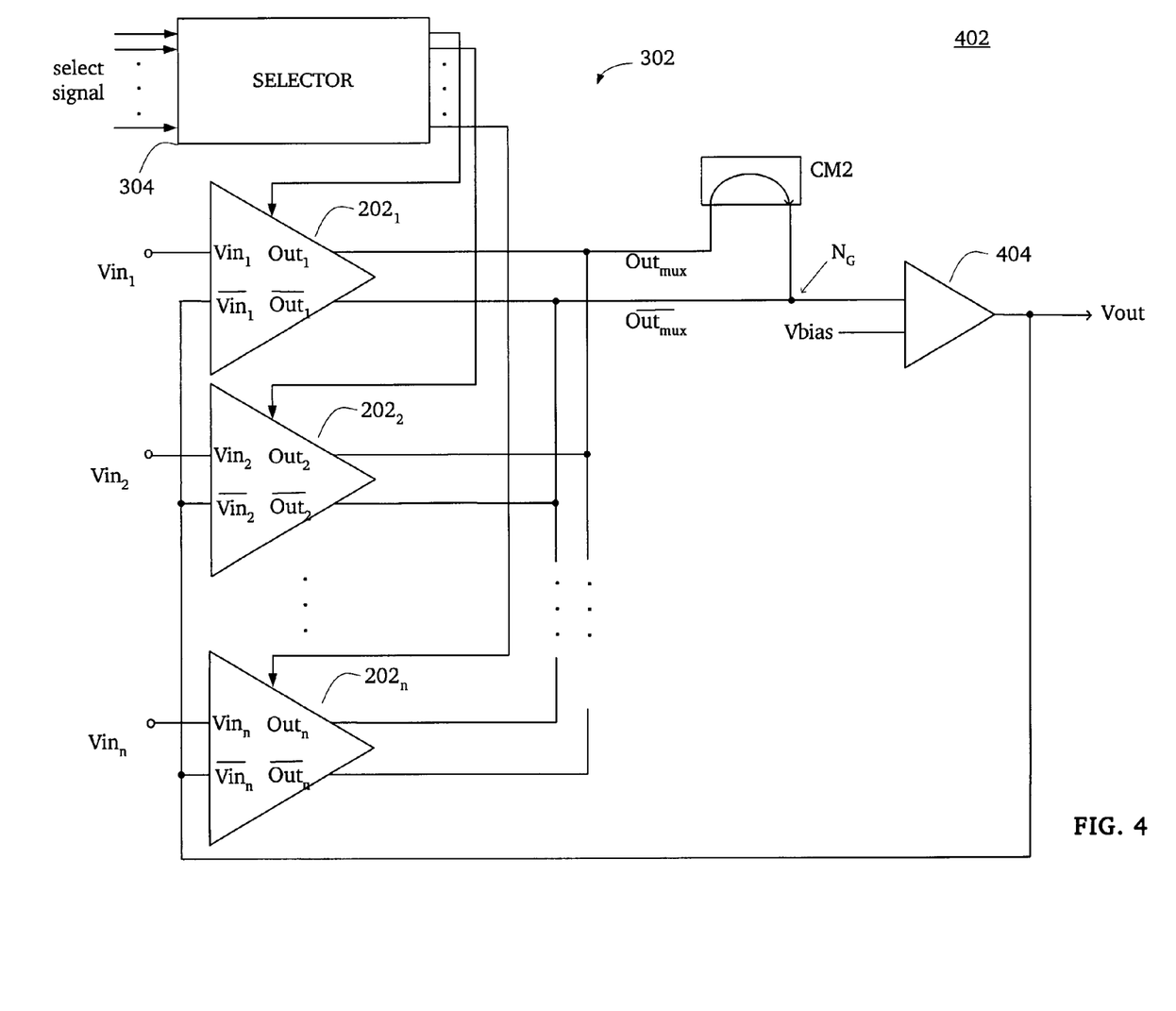
FIG. 4 is a circuit diagram of a multiplexing amplifier, according to an embodiment of the present invention.

FIG. 4 shows a multiplexing amplifier 402, according to an embodiment of the present invention. As can be appreciated from FIG. 4, the multiplexing amplifier 402 builds upon the circuits discussed above. More specifically, the multiplexing amplifier 402 is shown as including the multiplexer 302 of FIG. 3, a current mirror CM2, and an output amplifier 404. The current mirror CM2 is used to combine the two current mode output signals of the multiplexer 302 at a gain node $N_G$ to produce a single-ended voltage signal, which is passed through the output amplifier 404. The output of the amplifier 404 is fed back as shown, providing for an operational feedback circuit. The difference in the currents at $Out_{mux}$ and $Out_{mux}$_bar causes the voltage at the gain node $N_G$ to move around. The voltage at the gain node $N_G$ is fed back to the input of the selected switched differential amplifier 202, such that a final value of output voltage (Vout) of the multiplexing amplifier is reached.

The output amplifier 402 can be a gain amplifier or a simple buffer. In another embodiment, the output amplifier 402 is removed and replaced with a wire, causing the output voltage (Vout) to be the voltage at the gain node $N_G$.

One of ordinary skill in the art would appreciate that the above circuits could essentially be flipped by replacing the NPN transistors with PNP transistors, and appropriately adjusting the supply voltage. One of ordinary skill in the art will also appreciate that other types of transistors, such as, but not limited to complimentary-metal-oxide-semiconductor (CMOS) type transistors (i.e., NMOS and PMOS) or junction field effect transistors (JFETs), can alternatively be used. Additionally, one of ordinary skill in the art would understand that fully complimentary versions of the above described circuits are also within the spirit and scope of the present invention.

Multiplexers in accordance with embodiments of the present invention can be used, e.g., to provide video muliplexers. In one specific example, embodiments of the present invention can multiplex RGB signals received from several video sources (e.g., DVD players, VCRs, tuners, digital cameras, etc.) into a single video display (also known as a monitor).

Figure 5:
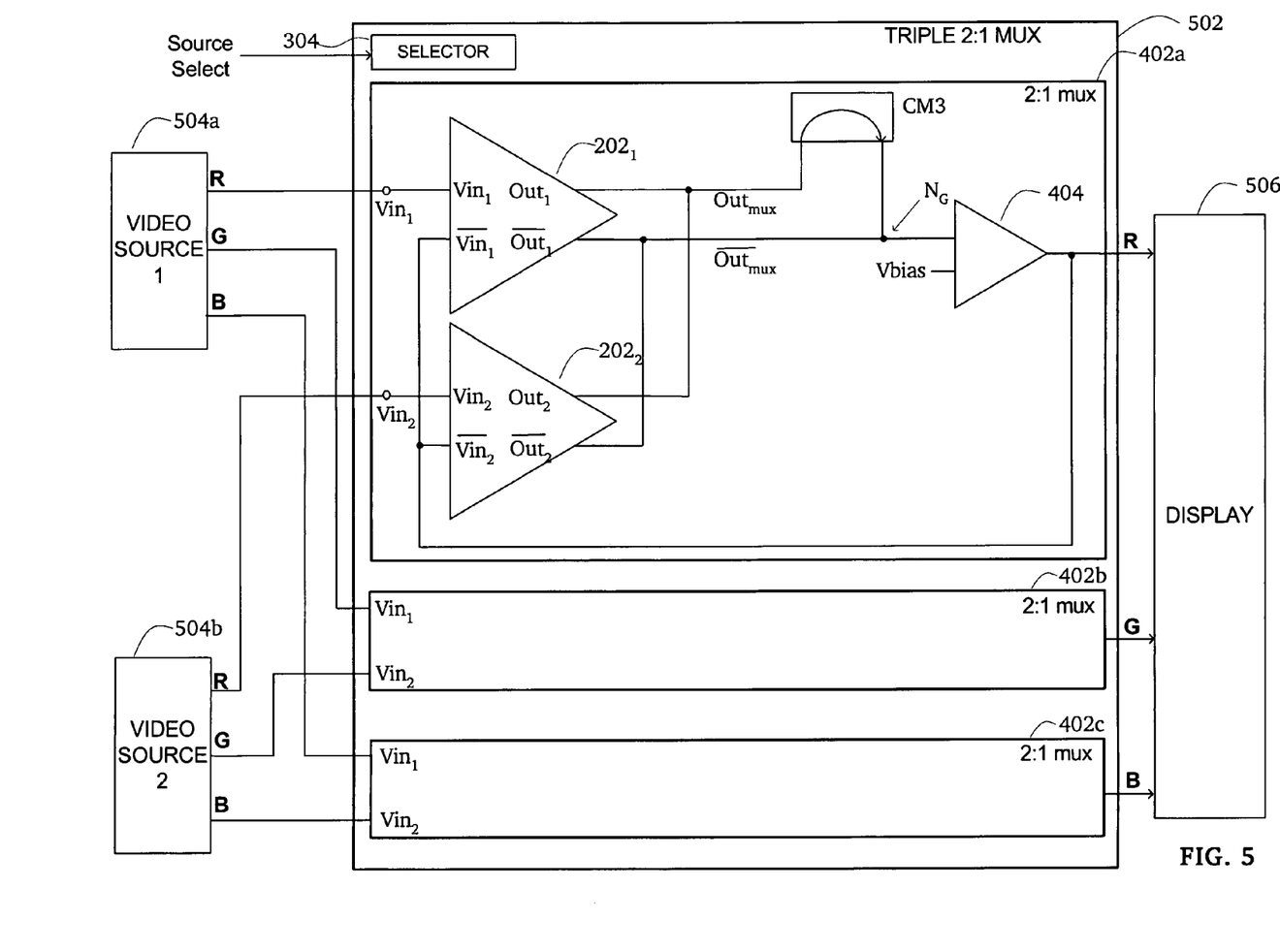
FIG. 5 illustrates how embodiments of the present invention can be used to produce a triple 2:1 video multiplexer.

For example, as shown in FIG. 5, embodiments of the present invention can be used to produce a triple 2:1 video multiplexer 502. Such a multiplexer 502 is useful for various types of applications, such as, but not limited to, set-top boxes, in-car navigation/entertainment, servers, security systems, video projectors, notebook computers, broadcast video and video crosspoint switching.

More specifically, the triple 2:1 video multiplexer 502 in FIG. 5 is made up of three 2:1 multiplexers 402a, 402b and 402c, which are each similar to the multiplexer 402 described above with reference to FIG. 4. A first video source 504a outputs a first RGB video signal, with the R portion of the signal being provided to the 2:1 mux 402a, the G portion of the signal being provided to the 2:1 mux 402b, and the B portion of the signal being provided to the 2:1 mux 402c. A second video source 504b outputs a second RBG video signal, with the R portion of the signal being provided to the 2:1 mux 402a, the G portion of the signal being provided to the 2:1 mux 402b, and the B portion of the signal being provided to the 2:1 mux 402c. Each 2:1 mux 402a, 402b, and 402c is substantially similar, and thus the details are only shown of the 2:1 mux 402a.

A source select signal is provided to the selector 304. Based on the source select signal, the selector 304 selects one of two switched differential amplifiers 202 (i.e., $202_1$ or $202_2$) within each 2:1 mux 402a, 402b and 402c. In this manner, the RGB signal from either the first video source 504a or the RGB signal from the second video source 504b (which may or may not be amplified) is output from the triple 2:1 mux 502 and provided to the display 506 (e.g., a television or other type of monitor).

This is just one example of how the embodiments of the present invention can be used. One of ordinary skill in the art will appreciate that there are numerous other related and unrelated uses for the multiplexer embodiments of the present invention.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A method for multiplexing using a plurality of differential amplifiers each of which includes a differential pair of input terminals, a differential pair of transistors, and a differential pair of output terminals, the method comprising:
   (a) accepting, at the differential pair of input terminals of each differential amplifier, a corresponding pair of voltage input signals;
   (b) accepting selection of only one of the differential amplifiers at a time and deselecting the other differential amplifiers; and
   (c) for each differential amplifier
      (c.1) presenting substantially unmodified versions of the corresponding pair of voltage input signals to control terminals of the corresponding differential pair of transistors, when the differential amplifier is selected; and
      (c.2) producing rejection voltage signals of substantially equal magnitude and opposite polarity to the corresponding pair of voltage input signals in order to reject the corresponding voltage input signals and thereby present substantially constant voltages at control terminals of the corresponding differential pair of transistors regardless of variations in the corresponding voltage input signals, when the differential amplifier is deselected.

2. The method of claim 1, wherein:
step (c.1) further comprises, when the differential amplifier is selected, turning on the corresponding differential pair of transistors so that current mode equivalents of the corresponding pair of voltage input signals are presented at further terminals of the corresponding differential pair of transistors, said further terminals forming the corresponding differential pair of output terminals of the differential amplifier; and
step (c.2) further comprises, when the differential amplifier is deselected, turning off the corresponding differential pair of transistors so that substantially zero level current outputs are presented at the differential pair of output terminals of the differential amplifier.

3. The method of claim 2, wherein step (c.2) includes using transconductors to produce the rejection voltage signals.

4. The method of claim 2, wherein step (c.2) includes:
converting the corresponding voltage input signals to proportional current signals; and
using passive resistances to convert the proportional current signals to the rejection voltage signals.

5. The method of claim 2, wherein the corresponding differential pair of outputs of each differential amplifier includes a first output and a second output, the method further comprising:
connecting together the first outputs of the plurality of differential amplifiers to form a first multiplexer output; and
connecting together the second outputs of the plurality of differential amplifiers to form a second multiplexer output.

6. The method of claim 5, further comprising providing the first multiplexer output to an input of a current mirror, and providing the second multiplexer output to an output of the current mirror, to thereby produce a single-ended multiplexer output at the output of the current mirror.

7. The method of claim 6, wherein each differential pair of input terminals includes a first terminal and a second terminal, the method further comprising:
connecting the second input terminals together; and
feeding back a version of a multiplexer output signal presented at the single-ended multiplexer output to the connected together second input terminals, the version either being the multiplexer output signal, a buffered version thereof, or an amplified version thereof.

8. The method of claim 2, wherein each differential amplifier produces first and second output signals, the method further comprising:
summing together the first output signals of the plurality of differential amplifiers to produce a first multiplexer output signal; and
summing together the second output signals of the plurality of differential amplifiers to produce a second multiplexer output signal.

9. The method of claim 8, further comprising combining the first and second multiplexer output signals into a single multiplexer output signal by providing the first multiplexer output signal to an input of a current mirror, and providing the second multiplexer output signal to an output of the current mirror, such that the single multiplexer output signal is produced at the output of the current mirror.

10. The method of claim 9, wherein each differential pair of inputs terminals includes a first input terminal and a second input terminal, the method further comprising:
feeding back a version of the single multiplexer output signal to the second input terminals of each differential amplifier, the version either being the actual single multiplexer output signal, a buffered version thereof, or an amplified version thereof.

11. A method for multiplexing using a plurality of differential amplifiers each including a differential pair of inputs, first and second input stages, a differential pair of transistors, and a differential pair of outputs, the method comprising:
(a) accepting corresponding first and second voltage input signals at each said differential pair of inputs;
(b) accepting selection of only one of said plurality of differential amplifiers at a time and deselecting the other differential amplifiers; and
(c) for each differential amplifier
(c.1) accepting the corresponding first voltage input signal at an input of the corresponding first input stage and presenting a substantially unmodified version of the corresponding first voltage input signal at an output of the corresponding first input stage when said first differential amplifier is selected, and presenting a substantially constant voltage at the output of the corresponding first input stage when said differential amplifier is deselected, regardless of variations in the corresponding first voltage input signal;
(c.2) accepting the corresponding second voltage input signal at an input of the corresponding second input stage and presenting a substantially unmodified version of the corresponding second voltage input signal at an output of the corresponding second input stage when said differential amplifier is selected, and presenting a substantially constant voltage at the output of the corresponding second input stage when said differential amplifier is deselected, regardless of variations in the corresponding second voltage input signal;
(c.3) providing the outputs of the corresponding first and second input stages to control terminals of the corresponding differential pair of transistors;
(c.4) when the differential amplifier is selected, turning on the corresponding differential pair of transistors so that current mode equivalents of the corresponding first and second voltage input signals are presented at further terminals of the differential pair of transistors, said further terminals forming the corresponding differential pair of outputs of the differential amplifier; and
(c.5) when the differential amplifier is deselected, turning off the corresponding differential pair of transistors so that substantially zero level current outputs are presented at the corresponding differential pair of outputs of the differential amplifier; and
(d) outputting corresponding first and second output signals at each said differential pair of outputs, such that the corresponding first and second output signals of the one differential amplifier selected at one time are current mode equivalents of the corresponding first and second voltage input signals, and the corresponding first and second output signals of the other differential amplifiers are substantially zero level current outputs.

12. The method of claim 11, wherein:
step (c.1) includes producing a first rejection voltage signal of substantially equal magnitude and opposite polarity to the corresponding first voltage input signal in order to reject the corresponding first voltage input signal and thereby present the substantially constant voltage at the output of the corresponding first input stage, when the differential amplifier is deselected, regardless of variations in the corresponding first input voltage signal; and step (c.2) includes producing a second rejection voltage signal of substantially equal magnitude and opposite polarity to the corresponding second voltage input signal in order to reject the corresponding second voltage input signal and thereby present the substantially constant voltage at the output of the corresponding second input stage, when the differential amplifier is deselected, regardless of variations in the corresponding second input voltage signal.

13. The method of claim 12, wherein steps (c.1) and (c.2) include:

converting the corresponding voltage input signals to proportional current signals; and using passive resistances to convert the proportional current signals to the corresponding rejection voltage signals.

14. The method of claim 12, wherein each differential amplifier produces first and second output signals, the method further comprising:

summing together the first output signals of the plurality of differential amplifiers to produce a first multiplexer output signal; and summing together the second output signals of the plurality of differential amplifiers to produce a second multiplexer output signal.

15. The method of claim 14, further comprising combining the first and second multiplexer output signals into a single multiplexer output signal by providing the first multiplexer output signal to an input of a current mirror, and providing the second multiplexer output signal to an output of the current mirror, such that the single multiplexer output signal is produced at the output of the current mirror.

16. The method of claim 15, wherein each differential pair of inputs includes a first input and a second input, the method further comprising:

feeding back a version of the single multiplexer output signal to the second input of each differential amplifier, the version either being the single multiplexer output signal, a buffered version thereof, or an amplified version thereof.

* * * * *